US008565702B2

(12) United States Patent
Thampi et al.

(10) Patent No.: US 8,565,702 B2
(45) Date of Patent: Oct. 22, 2013

(54) AUDIO HOLE SUPPRESSION METHOD AND APPARATUS FOR A TWO-WAY RADIO

(75) Inventors: Geetha K. Thampi, Sunrise, FL (US); Charles H. Carter, Sunrise, FL (US); Jesus F. Corretjer, Weston, FL (US); Yadunandana N. Rao, Sunrise, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 564 days.

(21) Appl. No.: 12/817,007

(22) Filed: Jun. 16, 2010

(65) Prior Publication Data

US 2011/0312294 A1 Dec. 22, 2011

(51) Int. Cl.
*H04B 1/10* (2006.01)
(52) U.S. Cl.
USPC .......................................... 455/212; 455/220
(58) Field of Classification Search
CPC .................................................... H03G 3/344
USPC ........... 455/212–213, 220–223; 375/346, 227
See application file for complete search history.

(56) References Cited

U.S. PATENT DOCUMENTS

| 7,512,199 | B2* | 3/2009 | Molev-Shteiman et al. . 375/350 |
| 7,593,372 | B2 | 9/2009 | Khoo et al. |
| 7,689,217 | B2 | 3/2010 | Ruelke et al. |
| 8,213,492 | B2* | 7/2012 | Molev-Shteiman et al. . 455/222 |
| 2004/0192215 | A1* | 9/2004 | Onggosanusi et al. ....... 455/222 |
| 2009/0034444 | A1* | 2/2009 | Wang et al. .................... 455/574 |

OTHER PUBLICATIONS

Robert Fl Fletcher, Jr.; Donald W. Burlage, US Army Missile Command; "An initialization Technique for Improved MTI Performance in Phased Array Radars"—Proceedings of the IEEE, vol. 60, pp. 1551-1552, Dec. 1972.
Edward S. Chornoboy—"Initialization for improved IIR Filter Performance", IEEE Transactions on Signal Processing, vol. 40, No. 3, Mar. 1992—pp. 543-550.

* cited by examiner

*Primary Examiner* — Lana N Le
(74) *Attorney, Agent, or Firm* — Barbara R. Doutre

(57) ABSTRACT

A channel scanning technique and apparatus provides audio hole suppression in two-way radio communications. Upon detecting the absence of a carrier signal on a priority channel during a priority scan mode of operation, a training waveform is constructed upon returning to the home-channel. The training waveform is applied to audio shaping filters within an audio lineup to suppress transients and minimize or eliminate the occurrence of audio pops at a speaker output thereby reducing the audio hole.

15 Claims, 5 Drawing Sheets

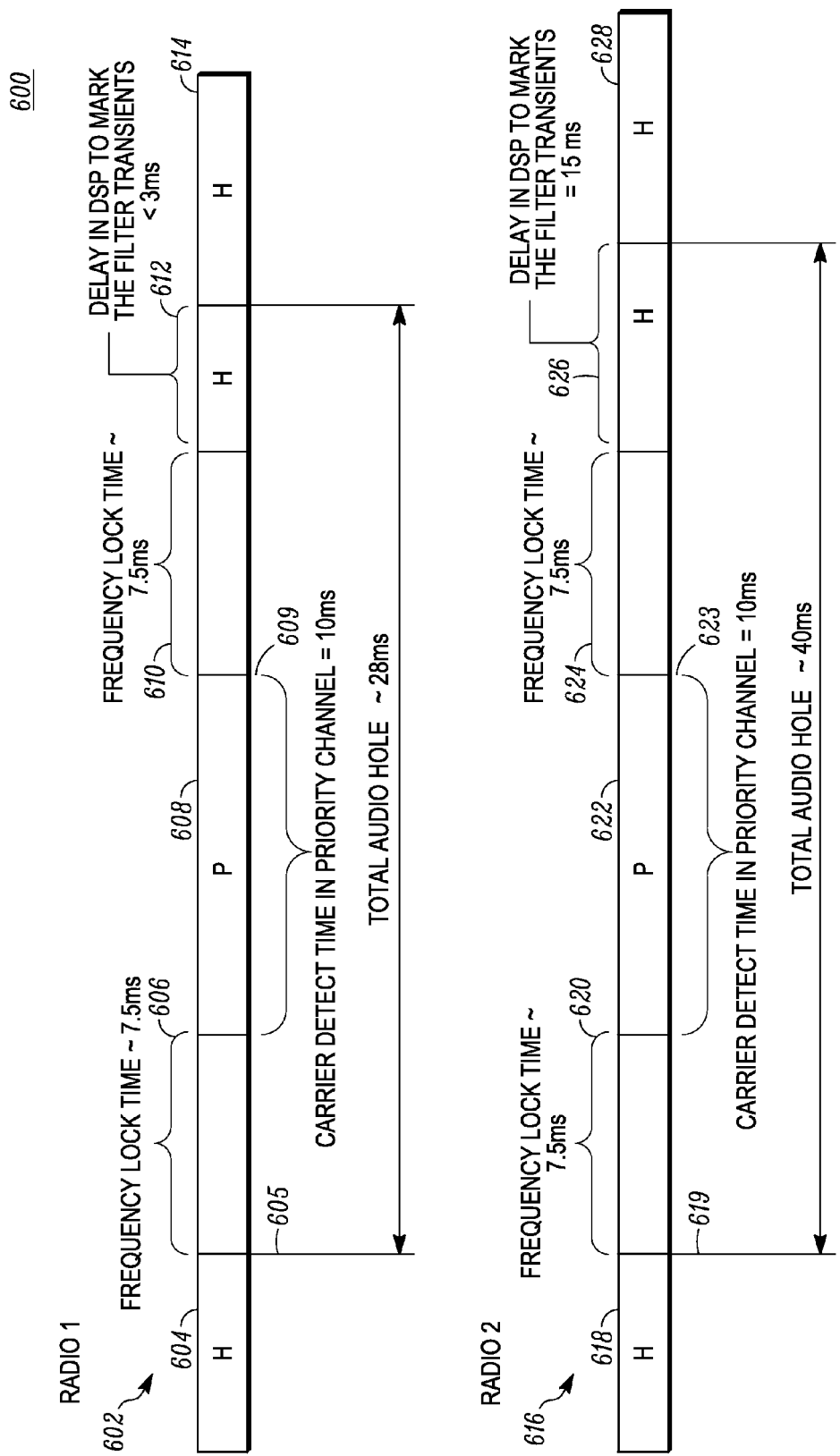

AUDIO HOLE SUPPRESSION METHOD AND APPARATUS FOR A TWO-WAY RADIO

FIELD OF THE DISCLOSURE

The present disclosure relates generally to wireless communication systems and more particularly to scanning a priority channel in a two-way radio system.

BACKGROUND

In a two-way radio communication system, handheld two-way radios and/or vehicular two-way radios communicate with each other in "direct mode" in which simplex transmissions between two devices are carried out directly over a shared channel. Because the communication system carries many communications at one time, a radio may need to monitor other communications in the system. Scan is a feature that allows a radio to monitor other communications in the system. During a scan, the radio locks on to a specific RF carrier signal and inspects activity that may be present on the carrier signal. A priority scan involves scanning a higher priority channel whilst engaged in actively (for example, a voice call) on a lower priority channel. The scan aims to determine whether any activity on the scanned channel is of interest, for example, whether the call on a scanned channel is addressed to the scanning radio. The scan involves switching away from the home-channel (RF) carrier signal of the active or in-use channel) on which the radio may be receiving a call, and switching to the RF carrier signal of the scan channel. This time away from the call during which the radio is engaged in on the active channel results in the radio missing some of the active channel call resulting in an "audio hole". If the scanned channel is carrying a communication that is not addressed to the radio or the scanned channel has no communications at all, then the radio returns to the call that it was previously engaged in and listening to on the active/home-channel.

Scanning of channels may result in audio artifacts creating pop-like sounds which are annoying to the user of the radio. A trivial solution to mask the pops is to mute the speaker for an extended duration so that the pops die down. However, this increases the time during which home-channel audio is masked out which is undesirable to the user of the radio. Various approaches for minimizing audio holes have included digital frame repetition in which a vocoder frame is repeated during priority sampling time that masks the audio hole. However, this approach can not be used in analog transmissions. Audio reconstruction approaches to minimizing audio holes involves linear predictions schemes. However, the performance of the audio reconstruction approaches is limited by signal-to-noise ratio as well as the types of speech/audio signals being processed. Channel marking approaches use past activity on a priority channel to adjust the priority sampling time (for future scans) and the sampling rate (how often to scan). However, the channel marking approaches use apriori information to alter the priority channel list and do not address minimizing the actual audio hole.

Accordingly, there is need for an improved priority channel scan for audio hole suppression in two-way radios.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 6 is an example of two timing diagrams comparing audio hole suppression in two radios, one radio with the audio hole suppression operating in accordance with an embodiment of the invention and one radio without.

Figure 1:
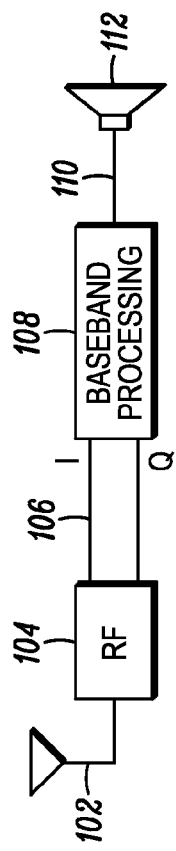
FIG. 1 is a diagram of a receiver incorporating priority scan for a two-way radio in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly there is described herein, a radio receiver having an audio lineup containing a series of audio shaping filters. On return from the priority channel, a training signal is constructed based on a few samples of the home-channel signal. This training signal is filtered through the audio lineup such that the filter states closely approximate the dynamics of the home-channel signal. By intelligently adjusting the filter states of the audio shaping filter stages, a transient response is minimized thereby minimizing an audio hole. As such, annoying audio artifacts (pops) are suppressed from being presented at a speaker.

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 1 is a diagram of a receiver incorporating priority scan for a two-way radio in accordance with an embodiment of the invention. Receiver 100 receives a radio frequency (RF) signal 102 which is processed through an RF stage 104 using known circuitry, such as filters, amplifiers, voltage controlled oscillator, automatic gain control (AGC), mixers, and analog-to-digital converter (ADC), which will not be discussed in any further detail. The RF stage 104 generates in-phase and quadrature (I/Q) signal 106. The I/Q signal 106 is digital signal which is subsequently processed though a baseband processing stage 108 formed and operating in accordance with the various embodiments of the invention to be described herein. The baseband processing stage 108 may be controlled via digital signal processor (DSP) or other digital audio processing means, such as ASICs, Gate Arrays, and FPGAs to name a few. The audio lineup includes a series of filters, embodied in the form of a finite impulse response (FIR) and infinite impulse response (IIR) filters as will be shown later. The baseband processing stage 108 performs filtering, demodulation and audio processing to convert the I/Q signal 106 into a differential signal 110 which is generated as an output at speaker 112. As receiver 100 enters into a scan mode of operation, the receiver leaves its home-channel and scans a priority channel to check for activity and then returns to the home-channel if no activity is detected. The audio at speaker 112 generated throughout the scanning process will have minimized (shorter) audio pops as a result of the audio processing incorporated within the baseband processing stage 108 to be described herein.

Figure 2:
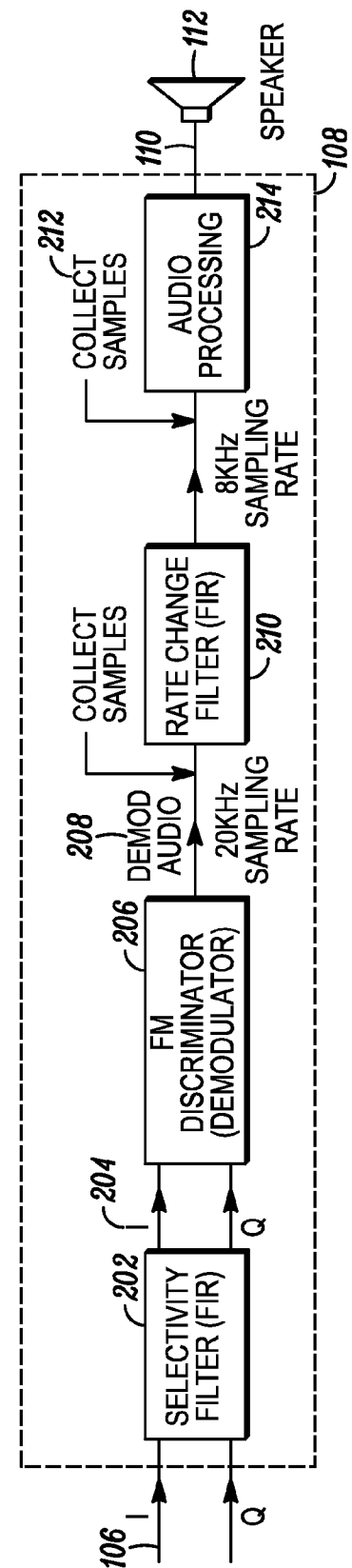
FIG. 2 is a diagram of a base band processing stage for priority scan of the receiver of FIG. 1 in accordance with an embodiment of the invention.

FIG. 2 is a diagram of the base band processing stage 108 in accordance with an embodiment of the invention. Baseband processing stage 108 processed the I/Q signal 106 through a selectivity filter 202 formed as a finite impulse response (FIR) filter to generate filtered I/Q signals 204. The filtered I/Q signal 204 is demodulated through FM discriminator 206 to generate a demodulated audio output signal 208. The demodulated audio output signal 208 is filtered by a rate change filter 210, embodied as another FIR filter, at a predetermined frequency, for example 20 kHz. FIR filters are linear phase filters with constant group delay. The rate change filter 210 filters demodulated audio output signal 208 to produce a regular audio signal 212 at a lower sampling rate, for example 8 kHz. The regular audio signal 212 is processed though an audio processing stage 214, formed and operating in accordance with the various embodiments, to generate differential signal 110 at speaker 112. In accordance with an embodiment of the invention, either the demodulated audio signal 208 or the regular audio signal 212 can be sampled to build a training waveform after locking back on the home-channel frequency during priority scan. In other words, the training waveform is constructed after the VCO has locked back on to the home-channel frequency in response to a carrier signal not being detected on the priority channel.

Figure 3:
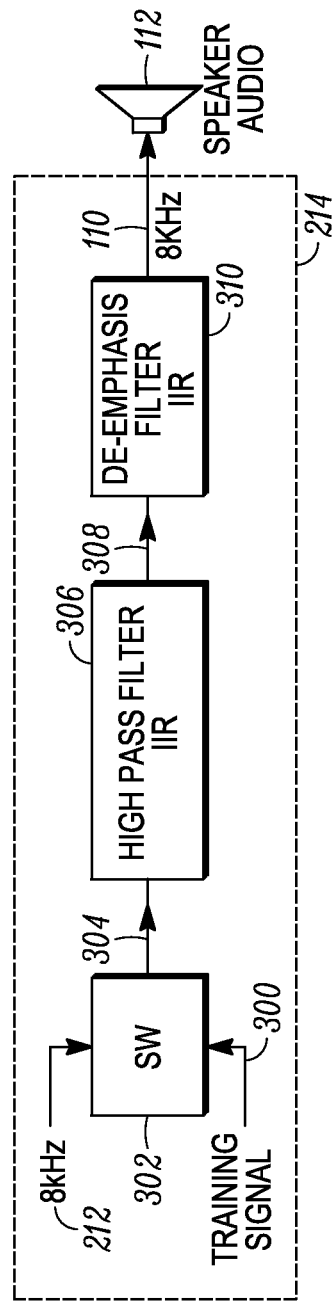
FIG. 3 is a diagram of an audio processing stage for priority scan within the baseband processing stage of FIG. 2 in accordance with an embodiment of the invention.

FIG. 3 is a diagram of the audio processing stage 214 in accordance with an embodiment of the invention. Audio processing stage 214 includes a switch 302 which switches between the regular audio signal 212 (the 8 kHz signal) and a training waveform 300 during priority scan. Audio hole reduction is achieved by minimizing the stack filter lineup settling time within audio processing stage 214.

Switch output 304 switches between the regular audio signal 212 during regular radio operation and training waveform 300 when priority scan is enabled and the radio returns to the home-channel after sampling the priority channel. Training waveform 300 automatically initializes audio processing 214 on return from priority scan to avoid audio pops. Switched output signal 304 (regardless of whether it is the regular audio signal 212 or the training waveform 300) is filtered through a high pass filter 306, such as a biquadrature infinite impulse response (IIR) filter to generate a high pass filter output signal 308. The IIR audio shaping filters have infinite impulse response which causes ringing when there is a discontinuity in the input samples after returning from priority channel. The use of the training signal during priority scan significantly reduces the transient response and thereby reduces the audio hole. By intelligently adjusting the filter states of the audio shaping IIR stages using the training signal the transient response is minimized. The high-pass filter output signal 308 is applied to de-emphasis filter 310, such as provided by another IIR filter, to generate a de-emphasized audio signal at 110. Accordingly, the audio processing stage 214 which filter the regular audio signal 212 is also configurable to automatically initialize the filters 306, 310 to minimize transients based on the intelligent initialization of the filters 306, 310 via the training waveform 300. The auto-initialization of the IIR filters 306, 310 in the audio processing stage 214 eliminates the filter transients thereby reducing the audio hole during priority scan.

The training waveform 300 is constructed based on the first few samples of the home-channel signal as well as the home-channel configuration. By filtering the training signal through the audio lineup, the filter states closely approximate the dynamics of the home-channel signal. The training signal length can be varied depending on the home-channel configuration and the sampled signal. For example the training signal may be varied based on the home-channel configuration of private line (PL) setting, digital private line (DPL) setting, bandwidth, and composite filter impulse response. The training signal may further be varied based on sampled parameters from the sampled signal, such as operating signal-to-noise ratio (SNR) and receiver sampling rate. The SNR can even be determined prior to the scan event if desired, because the home-channel audio is being received all the time when the radio is not scanning.

The PL/DPL settings are radio personality settings that can be used to optimally configure the audio lineup initialization. Typically, the PL and DPL are inserted in the transmitted signal stream to enable private calls. Thus, when returning from a priority channel back to a home-channel which has PL/DPL enabled, the dynamics of the transients caused by the audio lineup filters will change. The initialization procedure can be fined tuned by exploiting this knowledge. For a PL signal, a training signal generated by simple linear interpolation of the first few home channel samples is sufficient to eliminate transients within the audio lineup on return from priority scan. The states of IIR filters 306, 310 will then be excited by this training signal which eliminates discontinuity and smoothens out the transients.

The training waveform 300 may also be generated by simple linear or non-linear interpolation (curve fit) between zero and the first sample from the home-channel. For example, for a state vector X(t) of an IIR system at time instant "t", the corresponding output y(t) are given by:

$$X(t)=AX(t-1)+Bu(t)$$

$$y(t)=C^T X(t-1)+Du(t)$$

The matrix A is the state transition matrix which comprises the IIR filter coefficients. On return from a priority channel, the state vector X(0) is reset to a null vector. The state X(t) is recursively computed as:

$$X(t) = \sum_{k=0}^{t-1} A^{t-1-k} Bu(k)$$

If u(k) embeds the training signal, then the state vector transitions to the state that approximates the input signal dynamics. Also, the initial transients are absorbed by the duration of the training signal.

Figure 4:
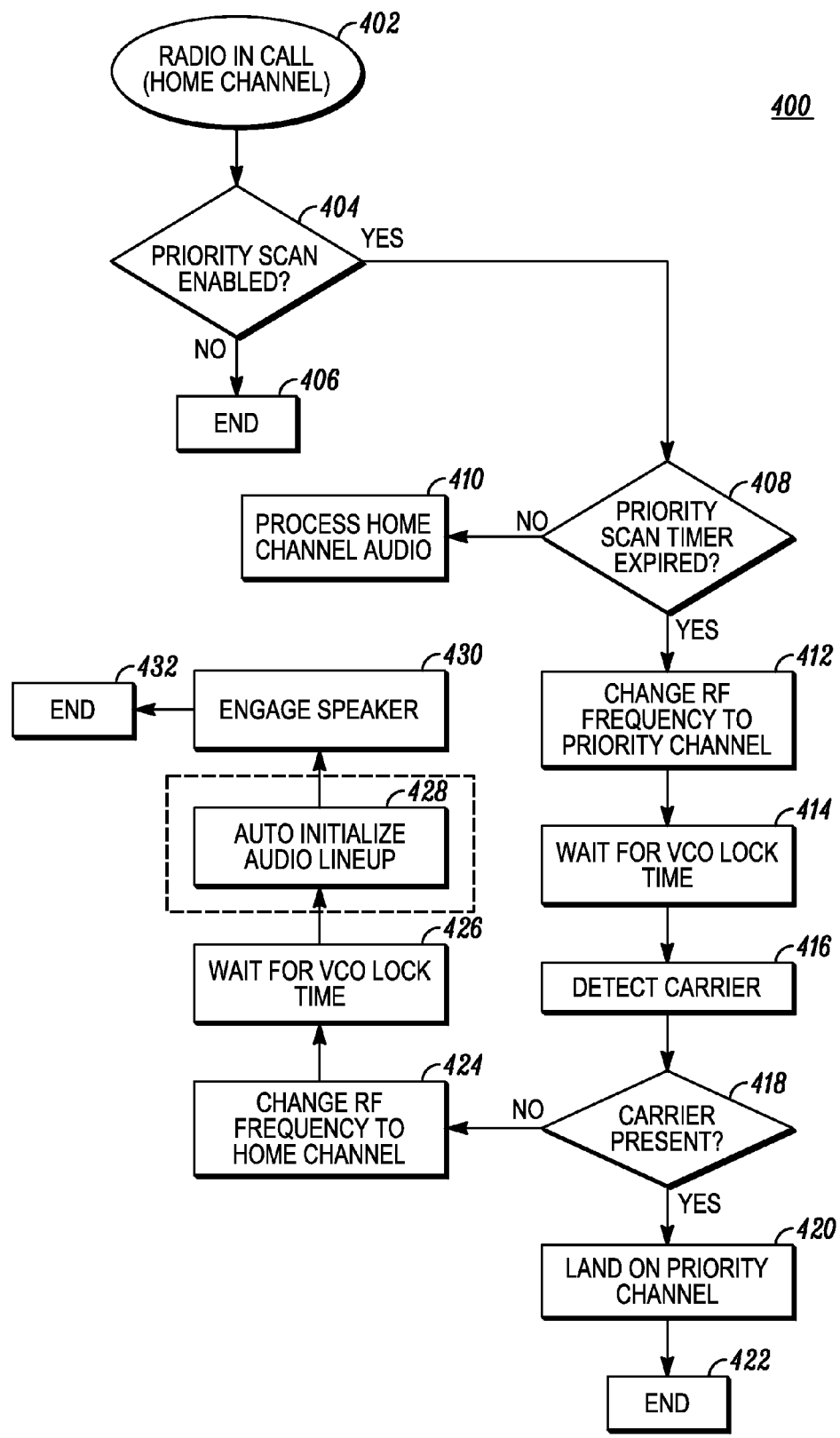
FIG. 4 is a flow diagram of a priority scan method in accordance with an embodiment of the invention.

FIG. 4 is a flow diagram of a priority scan method 400 in accordance with an embodiment of the invention. The method begins by placing a radio in a call at 402, the call being on the home-channel. A check is made to see if priority scan is enabled at 404, and if not, the method ends at 406. If priority scan is enabled at 404, then a check is made as to whether the priority scan timer has expired at 408. If the timer has not expired at 408, then home-channel audio is processed at 410—this is basically a wait period for entering into scan mode once scan has been enabled. Priority scan typically runs every 300-500 msec. Once the scan timer has expired at 408, then the radio's RF frequency changes from the home-channel to the priority channel at 412. A wait time transpires at 414 to allow time for the radio's VCO to lock and detect carrier a carrier signal at 416. When the carrier signal is detected at 418 then the receiver lands on the priority channel and stays there until it loses carrier. If no carrier is present at 418, then the RF channel frequency is changed back to the home-channel at 424. A receiver waits for the VCO to lock back on to the home-channel at 426. Once the VCO has locked then the auto-initialization of the audio line up occurs at 428 in accordance with the various embodiments. Once the initialization of the audio lineup is complete at 428, the speaker is engaged at 430 and the method ends with audio generated at the speaker. The auto-initialization of the audio line-up results in transients being reduced or eliminated. Thus, improved audio is generated at the speaker with fewer or shorter audio pops during times when a radio does not detect a carrier upon returning from scan.

Figure 5:
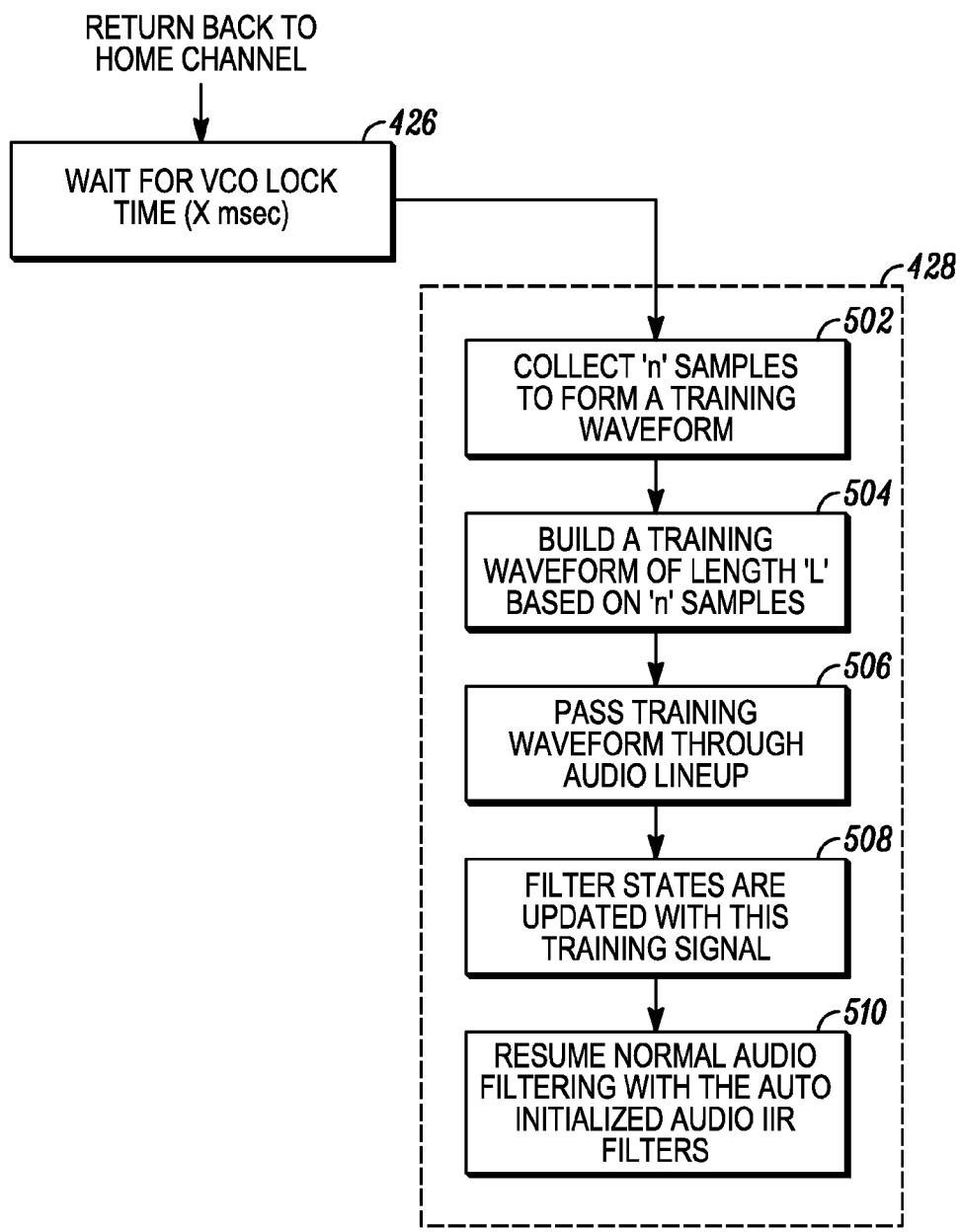
FIG. 5 is a flow diagram of automated initialization of the audio line-up within the priority scan method of FIG. 4 in accordance with an embodiment of the invention.

FIG. 5 is a flow diagram of the automated initialization method 500 of the audio line-up in accordance with an embodiment of the invention. Upon returning back to the home-channel at 424, the receiver waits for the VCO to lock back on to the home-channel at 426 (X msec) and then proceeds to the auto-initialization of the audio line up at 428. The auto-initialization of the audio line up 428 is achieved by collecting (n) samples to form a training waveform at 502. A training waveform of length (L) is built based on the (n) samples at 504. The number of samples (n) is configurable and the length of samples (L) is also configurable, thereby allowing for a configurable training sequence to be generated.

The training waveform can be generated at 504 using numerous approaches, for example linear interpolation, non-linear curve fit, and template based approaches, to name a few. The selection of how the training waveform is generated and the selection of the waveform length (L) can be based on, for example, the home-channel configuration, the home-channel signal-to-noise ratio (SNR), composite audio filter impulse response duration and characteristics, to name a few. Examples of home-channel configuration include, but are not limited to: PL/DPL settings, SNR, receive sampling rates and filter impulse response. Thus, the ability to build the training waveform at 504 is highly configurable and can be adapted for different receiver configurations.

Once the training waveform has been built at 504, the training waveform is passed though the audio line-up at 506. Step 506 aligns with the training waveform 300 of FIG. 3 being switched in to audio processing stage 214. Filter states of the audio processing stage are updated with the training signal at 508. Step 508 aligns with high pass filter 306 and de-emphasis filter 310 being updated with training waveform 300 at FIG. 3. Once the filters (306, 310 of FIG. 3) are updated at 508, normal audio filtering with the auto initialized audio IIR filters (306, 310) resumes at 510.

FIG. 6 is an example of two timing diagrams 602, 616 comparing audio holes in two radios, Radio 1 and Radio 2 respectively. Radio 1 operates in accordance with the audio hole suppression embodiments of the invention, and radio 2 does not incorporate the audio hole suppression of the current invention but rather delays the audio filter output (for example by 10-15 msec) which allows for the ringing (transients) to settle down thus extending the audio hole. The timing diagrams of FIG. 6 are based on measured data but are intended for illustrative purposes only as variations in the timing will exist depending on a radio's overall receiver configuration and the configurability of the audio hole suppression technique. Radio 1, timing diagram 602 begins by receiving a call on the home-channel at 604. At 605 priority scan is enabled. The amount of time (the wait) that it takes the VCO to lock on the priority channel is illustrated at 606. The VCO lock time is based on hardware in this example is about 7.5 msec. The amount of time to detect a carrier signal on the priority channel is illustrated at 608. Carrier detection time in this example is approximately 10 msec. When no carrier is detected and the RF frequency is changed back to the home-channel at 609, the amount of time for the VCO to lock on the home-channel frequency is illustrated by 610. In this example the VCO lock time 610 is approximately 7.5 msec. The delay incurred within the DSP to mask the filter transients was measured at 612 as approximately 3 msec. The amount of time between priority scan being enabled at 605 and home-channel operation at 613 comprises the total audio hole time. In this example the total audio hole time was measured as approximately 28 ms.

By comparison, Radio 2, timing diagram 616 shows a call being received on the home-channel at 618. At 619 priority scan is enabled. The amount of time (the wait) that it takes the VCO to lock on the priority channel is illustrated at 620. The amount of time to detect a carrier signal on the priority channel is illustrated at 622. When no carrier is detected and the RF frequency is changed back to the home-channel at 623, the amount of time for the VCO to lock on the home-channel frequency (the wait) is illustrated by 624. The time frames of home-channel call 618, VCO lock time (wait time to lock on priority channel) 620, carrier detect time 622, and VCO lock time (wait time to go back on home-channel) 624 are similar to those of Radio 1. However, the delay in the DSP to mask filter transients is shown to be approximately 15 ms at 626, and operation is back on the home-channel at 628. The amount of time between priority scan being enabled and full home-channel operation comprises the total audio hole time. In the Radio 2 example, which does not incorporate the priority scan hole suppression, the total measured audio hole time was 40 ms.

As seen from the illustrated timing diagrams 602, 616 the auto-initialization of the audio line-up in accordance with the various embodiments can provide a significant impact on shortening delays through the DSP audio processing line-up. Since the VCO lock times and settling times are dependent on the receiver hardware little control is available over the VCO lock time. Likewise, carrier detection times are fixed based on required detection rates and allowed falsing probability. Thus, the opportunity for audio hole reduction has been achieved by minimizing the DSP stack filter lineup settling time. The auto-initialization of the filters in the audio lineup eliminates the filter transients thereby reducing the audio hole during priority scan.

While described in terms of priority scan, the audio hole suppression is applicable to any situation where an audio stream is subject to a discontinuity which creates a transient causing audio artifacts (pops) at the speaker. For example, applications in which an audio stream is discontinued to generate an alert tone at the speaker might create a transient. Such a transient and potential audio hole generated therefrom can be minimized using the audio hole apparatus and suppression techniques of the various embodiments of the invention. The audio processing stage 214 in these other types of non-scan embodiments can have digital filters providing other types of filtering besides high pass and de-emphasis filtering. The configurability of the audio processing stage 214 lends itself to many audio hole suppression applications.

Accordingly, there has been provided a priority scan method and apparatus that significantly reduces audio holes during priority scan. Real time operation is preserved while the audio hole duration is reduced. By intelligently adjusting the filter states of the audio shaping IIR stages within a receiver during priority scan, transient responses are minimized thereby reducing audio holes. The radio user will thus experience a much shorter audio hole in priority scan. The training waveform generated as part of the technique can be adapted to best suit the receiver's home-channel configuration. The overall automation of the filter initialization minimizes any major circuitry changes to the receiver thus minimizing any significant cost increase. The audio hole suppression provided by the various embodiments is easy to implement and incorporate within a DSP as the approach is not computationally intensive.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A radio receiver, comprising:
   a radio frequency (RF) stage for converting an RF signal to a digital signal on a home-channel;
   a baseband processing stage for converting the digital signal to an audio signal;
   a speaker for outputting the audio signal;
   the baseband processing stage having an audio lineup with a plurality of audio shaping filters, the plurality of audio shaping filters being initialized with a training waveform, the training waveform being constructed upon return from a priority channel to the home-channel during a priority scan mode based on a sampled demodulated signal from the audio lineup and a home-channel configuration, the training waveform reducing a transient response at the plurality of audio shaping filters thereby suppressing an audio artifact from being presented at the speaker; and
   a rate change filter for converting a demodulated signal down to a lower sampling rate demodulated filtered signal and wherein the training waveform is constructed using samples taken from the demodulated filtered signal at the lower sampling rate.

2. The radio receiver of claim 1, further comprising:
   a digital signal processor (DSP); and
   the training waveform being constructed by the DSP, and the DSP controlling an application of the training waveform to the plurality of audio shaping filters, the training waveform being configurable by the DSP based on the sampled demodulated signal and the home-channel configuration.

3. A two-way radio, comprising:
   a digital signal processor (DSP);
   a transmitter;
   a receiver;
   a speaker;
   the receiver including an audio lineup having an audio processing stage having audio shaping filters under the control of the DSP;
   the DSP constructing a training waveform during a priority scan mode of operation in which the receiver goes from home-channel to priority channel and back to home-channel without detecting a carrier, the training waveform adjusting the audio shaping filters of the audio processing stage such that a transient response during priority scan mode is minimized thereby providing audio hole suppression at the speaker upon returning to the home-channel; and
   a demodulator for generating a demodulated audio signal within the audio lineup; and
   a switch controlled by the DSP and coupled to the audio processing stage, the switch switching between the demodulated audio signal and the training waveform in response to priority scan being enabled and a carrier frequency being detected, wherein the audio shaping filters of the audio processing stage comprise infinite impulse (IIR) high pass filters and IIR de-emphasis filters; and the switch applying the training waveform to the IIR high pass filters and IIR de-emphasis filters to automatically initialize the audio lineup.

4. The two-way radio of claim 3, wherein the audio shaping filters comprise infinite impulse (IIR) filters, the IIR filters being automatically initialized in response receiving the training waveform from the DSP.

5. The two-way radio of claim 3, wherein the training waveform is configurable.

6. The two-way radio of claim 5, wherein the training waveform has a length which is configurable based one or more of:
   operating signal-to-noise ratio (SNR); and
   overall impulse response of the audio lineup.

7. The two-way radio of claim 3, wherein the audio shaping filters are automatically initialized in response to receiving the training waveform from the DSP, the training waveform being generated based on sampling a demodulated signal from the audio lineup and generating the training waveform based on at least one sampled signal parameter of the sampled demodulated signal and home-channel configuration.

8. The two-way radio of claim 7, wherein:
   the sampled signal parameter comprises at least one of signal-to-noise ratio (SNR), and receive sampling rate; and
   the home-channel configuration comprises at least one of private line/digital private line (PL/DPL) settings, composite filter response, and channel bandwidth.

9. The two-way radio of claim 3, wherein the audio lineup further comprises a demodulator for generating a demodulated audio signal, the demodulated audio signal being sampled by the DSP to generate a sampled demodulated audio signal, the sampled demodulated audio signal and the home-channel configuration being used to construct the training waveform.

10. A two-way radio, comprising:
    a digital signal processor (DSP);
    a transmitter;
    a receiver;
    a speaker;
    the receiver including an audio lineup having an audio processing stage having audio shaping filters under the control of the DSP;
    the DSP constructing a training waveform during a priority scan mode of operation in which the receiver goes from home-channel to priority channel and back to home-channel without detecting a carrier, the training waveform adjusting the audio shaping filters of the audio processing stage such that a transient response during priority scan mode is minimized thereby providing audio hole suppression at the speaker upon returning to the home-channel; and wherein the audio lineup further comprises:
    a radio frequency (RF) stage for receiving an RF signal and converting the RF signal to a digital I/Q signal;
    a selectivity filter for filtering the digital I/Q signal into a filtered I/Q signal;
    a demodulator for demodulating the filtered I/Q signal into a demodulated audio signal;
    a rate change filter for changing a frequency of the demodulated audio signal, the rate change filter being coupled to the audio processing stage; and
    the training waveform being constructed based on samples taken of the demodulated audio signal and the home-channel configuration.

11. A method for scanning a radio channel, comprising:
    communicating on a home-channel;
    enabling priority scan;
    changing over to a priority channel;
    detecting whether a carrier signal is present on the priority channel;
    changing back to the home-channel in response to not detecting a carrier signal on the priority channel;
    constructing a training waveform based on a configuration of the home-channel;
    automatically initializing an audio processing stage of an audio lineup with the training waveform to minimize an audio hole at an output of the audio lineup; and
    wherein construction of the training waveform is based on: operating signal-to-noise ratio (SNR), private line/digital private line settings, receive sampling rate, overall filter impulse response of the audio lineup, and bandwidth.

12. The method of claim 11, wherein automatically initializing the audio processing stage comprises:
    passing the training waveform through the audio processing stage; and
    updating filtering states of the audio processing stage with the training waveform.

13. The method of claim 12, wherein constructing the training waveform comprises:
    sampling a predetermined number of demodulated audio signals; and
    constructing the training waveform of a predetermined length based on the sampled demodulated audio signals and the configuration of the home-channel.

14. The method of claim 11, wherein changing over to a priority channel further comprises waiting for a voltage controlled oscillator (VCO) to lock on a priority channel frequency; and
    changing back further comprises waiting for the VCO to lock on a home-channel frequency.

15. The method of claim 14, further comprising engaging a speaker to play out audio from the output of the audio lineup with the minimized audio hole after automatically initializing the audio processing stage with the training waveform.

* * * * *